(12) United States Patent
Frenzel

(10) Patent No.: US 10,641,828 B2
(45) Date of Patent: May 5, 2020

(54) SENSOR DEVICE FOR MEASURING A CURRENT FLOW HAVING A UNIVERSAL GROUND CONTACT ELEMENT

(71) Applicant: Continental Automotive GmbH, Hannover (DE)

(72) Inventor: Henryk Frenzel, Regensburg (DE)

(73) Assignee: Continental Automotive GmbH (DE)

( * ) Notice: Subject to any disclaimer, the term of this patent is extended or adjusted under 35 U.S.C. 154(b) by 220 days.

(21) Appl. No.: 15/745,848

(22) PCT Filed: Jul. 22, 2016

(86) PCT No.: PCT/EP2016/067484
§ 371 (c)(1),
(2) Date: Jan. 18, 2018

(87) PCT Pub. No.: WO2017/016993
PCT Pub. Date: Feb. 2, 2017

(65) Prior Publication Data
US 2018/0217211 A1  Aug. 2, 2018

(30) Foreign Application Priority Data

Jul. 24, 2015 (DE) .................. 10 2015 214 069
Sep. 29, 2015 (DE) .................. 10 2015 218 794

(51) Int. Cl.
*G01R 31/364* (2019.01)
*G01N 27/416* (2006.01)
(Continued)

(52) U.S. Cl.
CPC ......... *G01R 31/364* (2019.01); *G01R 31/382* (2019.01); *H01R 4/10* (2013.01);
(Continued)

(58) Field of Classification Search
CPC .. G01R 31/364; G01R 31/382; G01N 27/416; H01R 13/41; H01R 13/42; H01L 23/495
See application file for complete search history.

(56) References Cited

U.S. PATENT DOCUMENTS

| 6,338,632 B1 | 1/2002 | Jones |
| 7,922,545 B2 | 4/2011 | Saitoh |

(Continued)

FOREIGN PATENT DOCUMENTS

| CN | 2454910 Y | 10/2001 |
| CN | 1674359 A | 9/2005 |

(Continued)

OTHER PUBLICATIONS

German Search Report for German Application No. 10 2015 218 794.2, dated May 13, 2016, including partial English translation, 7 pages.

(Continued)

*Primary Examiner* — Neel D Shah
(74) *Attorney, Agent, or Firm* — RatnerPrestia

(57) ABSTRACT

A sensor device for measuring a current flow, having a sensor element for detecting the current flow, a first contact element for connecting the sensor element to the current source, a ground contact element for connecting the sensor element to a ground, wherein the ground contact element includes a first and second electrically conductive connector element, wherein the first connector element has a hole-like opening and wherein the second connector opening has a connector point, which can be pressed into the hole-like opening of the first connector element, such that the second connector element is fastened to the first connector element.

14 Claims, 2 Drawing Sheets

(51) Int. Cl.
*H01R 13/41* (2006.01)
*H01R 13/42* (2006.01)
*H01L 23/495* (2006.01)
*G01R 31/382* (2019.01)
*H01R 11/28* (2006.01)
*H01R 4/50* (2006.01)
*H01R 4/10* (2006.01)
*G01R 15/20* (2006.01)

(52) U.S. Cl.
CPC ......... *H01R 4/5016* (2013.01); *H01R 11/287* (2013.01); *G01R 15/207* (2013.01)

(56) References Cited

U.S. PATENT DOCUMENTS

| | | | |
|---|---|---|---|
| 8,371,884 B2 | 2/2013 | Mazingue-Desailly et al. | |
| 8,502,501 B2* | 8/2013 | Nentwig | H01R 11/287 320/111 |
| 8,754,510 B2 | 6/2014 | Minamio et al. | |
| 2005/0206387 A1* | 9/2005 | Hirthammer | H01R 13/5202 324/426 |
| 2007/0025065 A1 | 2/2007 | Tanizawa | |
| 2011/0050240 A1 | 3/2011 | Nentwig et al. | |

FOREIGN PATENT DOCUMENTS

| | | |
|---|---|---|
| CN | 102725844 A | 10/2012 |
| CN | 202651320 U | 1/2013 |
| DE | 102004013659 A1 | 10/2005 |
| DE | 102007057501 A1 | 6/2009 |
| DE | 102009000827 A1 | 8/2010 |
| DE | 102013011967 A1 | 1/2015 |

OTHER PUBLICATIONS

International Search Report and Written Opinion for International Application No. PCT/EP2016/067484, dated Sep. 29, 2016, 8 pages.
Korean Office Action for Korean Application No. 10-2018-7005507, dated Dec. 7, 2018, with translation, 9 pages.
Korean Notice of Allowance for Korean Application No. 10-2018-7005507, dated May 17, 2019, with translation, 3 pages.
Chinese Office Action for Chinese Application No. 201680043438.5, dated Aug. 16, 2019, with partial English translation, 9 pages.

* cited by examiner

SENSOR DEVICE FOR MEASURING A CURRENT FLOW HAVING A UNIVERSAL GROUND CONTACT ELEMENT

CROSS REFERENCE TO RELATED APPLICATIONS

This application is the U.S. National Phase Application of PCT International Application No. PCT/EP2016/067484, filed Jul. 22, 2016, which claims priority to German Patent Application No. 10 2015 214 069.5, filed Jul. 24, 2015 and Application No. 10 2015 218 794.2 filed Sep. 29, 2015, the contents of such applications being incorporated by reference herein.

FIELD OF THE INVENTION

The invention relates to a sensor device for measuring a current flow.

BACKGROUND OF THE INVENTION

In many electronic products, it is necessary to exactly determine or measure currents. Such measurements may be performed for example by means of Hall sensors or by means of a measuring resistor. During the measurement with a measuring resistor, also referred to as shunt, the current intensity is measured by means of the voltage drop that arises in the case of a current flow across the known measuring resistor.

One usage example for this is a battery sensor which monitors the state of a vehicle battery and the current flow thereof. The measuring resistor is in this case arranged between the contact element in the form of a battery terminal and the ground contact element, which is connected by means of a cable to the vehicle chassis.

Here, the ground contact element is adapted, as an interface, to a particular variant of a ground connector. This however yields the problem that, owing to the variety of variants of the ground connectors, high costs arise with regard to the logistics and production of the battery sensor, in particular of the ground contact element. Furthermore, certain variants, with regard to their specific interface, exhibit reduced conductivity or can be more easily destroyed or rendered unusable. The conventional ground connectors include for example those which have a bolt with thread, and also those which comprise a metal sheet with connected ground cable.

The document US 2007/0025065 A1, which is incorporated by reference discloses a fastening device for a current sensor which operates in accordance with the Hall principle. The current sensor is fitted between the negative terminal of a battery and a grounding element. A grounding cable, which is connected at its first end to the negative terminal of the battery, has a ring-shaped cable lug on its second end. The ring-shaped cable lug is, by means of a screw-nut fastening element, clamped to said fastening element. As a result of the tightening of the fastening element, the screw, the washer, the cable lug of the grounding cable and the sensor are pressed against one another. Here, an electrically conductive connection of the grounding cable to the fastening element is produced. Furthermore, the fastening element is connected in electrically conductive fashion to the grounding element. The Hall sensor has an electrically insulating housing with an opening. The fastening element is pressed into the opening of the insulating Hall sensor housing. Owing to the press-fit of the electrically conductive fastening element with the electrically insulating sensor housing, the Hall sensor is mechanically fastened to the fastening element.

SUMMARY OF THE INVENTION

An aspect of the invention aims to provide an inexpensive and reliable sensor device which eliminates the stated problems.

The sensor device according to an aspect of the invention makes it possible to realize a universal interface with respect to different variants of a ground connector or second connecting element in that, for all variants, a hole-like opening is used in which the second connecting element is fixed by being pressed in. This yields a high degree of modularity, because the sensor arrangement according to the invention can be connected to numerous differently designed ground connector types without the need for the sensor arrangement to be respectively adapted for this purpose. Furthermore, the production process is simple and inexpensive, because it is for example possible to dispense with joining methods such as brazing. The connection is furthermore reliable and ensures good current conduction owing to the close contact as a result of the pressing-in.

In one refinement of the invention, the hole-like opening of the first connecting element and/or the connecting point of the second connecting element are deformed such that they can be regionally pressed into one another. This may be achieved inter alia in that the connecting point of the first connecting element has a circle-like contour. This may be understood for example to mean a contour which is basically circular but has discontinuities, indentations or regional bulged portions, against which the second connecting element can be pressed. By means of the circle-like contour, it is possible for an interference fit to be realized particularly easily, in particular if the second connecting element as a counterpart has a circular contour.

A circle-like contour is preferably to be understood to mean a contour which runs within a circular ring but which preferably has unevennesses or which does not run in a fully circular manner.

The sensor device according to an aspect of the invention is advantageously refined in that the contour of the hole-like opening has a shape defined by circular segments adjoining one another, the central points of which lie on the corners of a polygon. Thus, at the hole-like opening, pressing edges form by means of which the connecting point of the second connecting element is fixed in a rotationally secured manner.

The sensor device according to an aspect of the invention is preferably refined in that the connecting point of the second connecting element has a cylindrical basic shape which is elastically or plastically deformable. This permits an easy pressing-in process into the first connecting element. This may be realized for example by means of a suitable material selection for the second connecting element and/or dimensioning of the connecting point or of the circular ring.

In a further advantageous embodiment of the sensor device according to an aspect of the invention, the connecting point of the second connecting element exhibits ductility which enables the connecting point to entirely or partially adopt the shape of the contour of the hole-like opening of the first connecting element. The fixing of the second connecting element is thus made very reliable.

The sensor device according to an aspect of the invention is advantageously refined in that the hole-like opening and/or the connecting point are of conical form. In this way, a greater radial contact pressure is generated in accordance with the principle of the oblique plane or of self-intensification.

In one refinement of an aspect of the invention, the sensor device is a battery sensor unit.

The sensor device according to an aspect of the invention is preferably refined in that, perpendicular to the pressing-in direction, the greatest extent of the connecting point corresponds at least to the smallest extent of the hole-like opening. This is expedient for the press-in connection.

The sensor device according to an aspect of the invention is advantageously refined in that the connecting point of the second connecting element is preferably formed as a hollow cylinder. By means of a pressure element within the hollow cylinder, it is thus possible for a force or a pressure to be generated directly on the inner side of the hollow cylinder, which force or pressure assists or effects the pressing-in process. If the pressure element subsequently remains in this position, the force or the pressure is thus not depleted over the service life of the connection, because internal support is provided.

It is preferable if the hollow cylinder, by means of a rivet or a pressed-in bolt on its inner side, forms an interference-fit connection with the first connecting element.

In one refinement of the invention, the hollow cylinder has an internal thread.

In a preferred refinement, the ground contact element has a screw or screw-nut connection to the internal thread of the hollow cylinder.

The sensor device according to an aspect of the invention is advantageously refined in that the hollow cylinder is formed as a sheet-metal flange.

In a further advantageous embodiment, the sheet-metal flange has a wall thickness which permits a deformation adequate for the pressing-together and/or has slots which permit a deformation adequate for the pressing-together.

The sensor device according to an aspect of the invention is advantageously refined in that the connecting point of the second connecting element projects beyond the first connecting element in the pressing-in direction, and is formed at its projecting region as a radial collar. The fixing can thus be performed in accordance with the rivet principle or by crimping.

Here, the radial collar preferably bears against the first connecting element.

In a further advantageous embodiment of the sensor device according to an aspect of the invention, the second connecting element has substantially a flat or a circular shape. These shape variants are common and easy to produce.

BRIEF DESCRIPTION OF THE DRAWINGS

The invention will be described in more detail below on the basis of four exemplary embodiments and drawings. In the drawings, in each case in a schematic illustration.

DETAILED DESCRIPTION OF THE PREFERRED EMBODIMENTS

Figure 1:
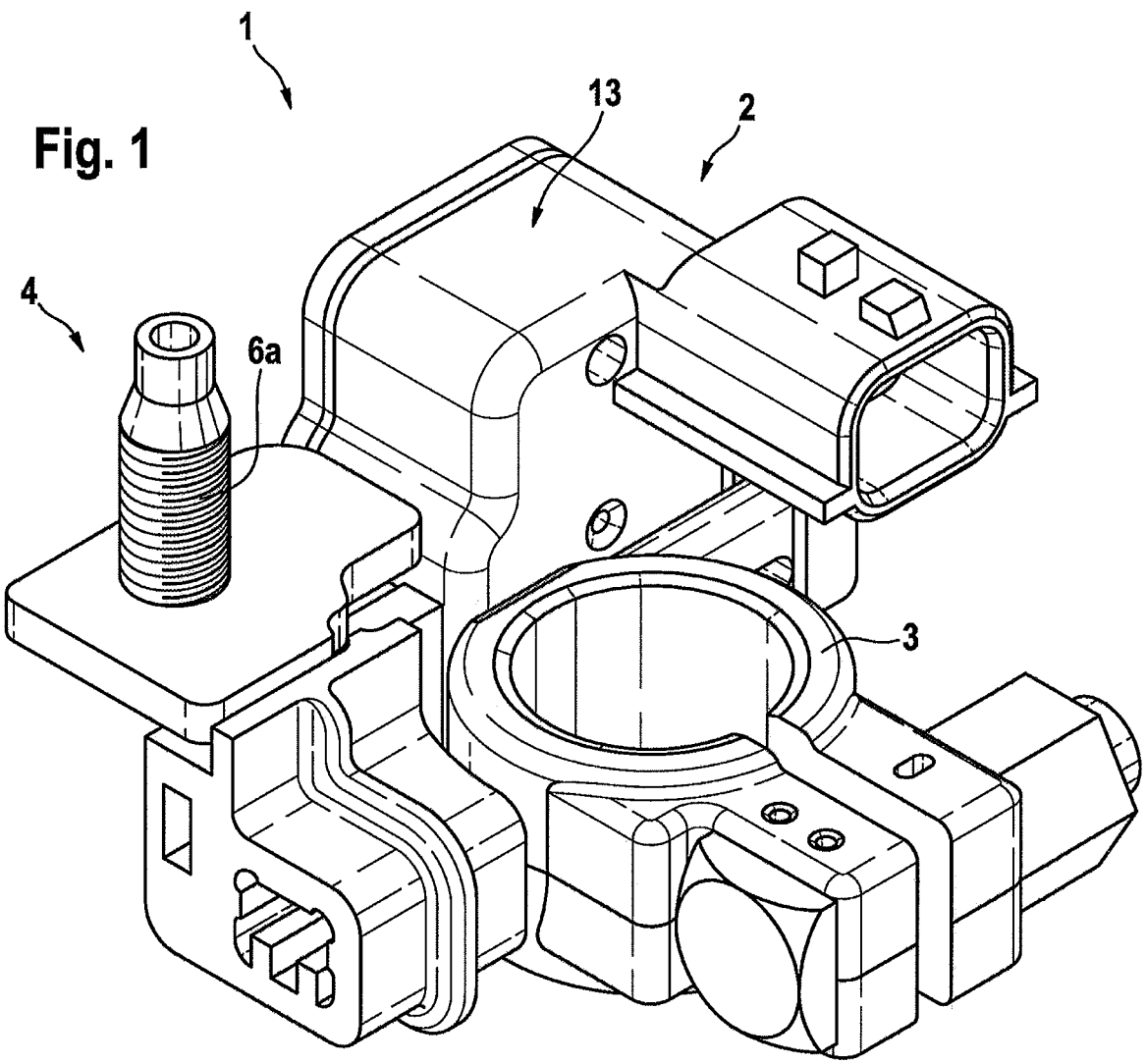
FIG. 1 shows a sensor device according to the prior art.

FIG. 1 shows a sensor device 1 according to the prior art, having a first contact element 3, a sensor element 2 and a ground contact element 4.

The sensor device 1 that is shown is a battery sensor unit which is connected to a battery (not shown) of a motor vehicle in order to detect the current or the voltage of the battery.

The connection to the battery is realized by means of the first contact element 3 in the form of a terminal post, which for this purpose is of sleeve-like form with an inner contour which fits with the terminal of the battery. To ensure a firm connection to the terminal, the contact element 3 is designed such that it can be tightened by means of a clamping screw.

In the drawing, the sensor element 2 in the form of a measuring resistor is concealed by a housing, and is connected in electrically conductive fashion both to the contact element 3 and to the ground contact element 4, such that a current flow from the battery to ground is made possible.

The ground contact element 4 comprises a bolt 6a with a thread. A ground cable can be fastened to a bolt 6a of said type by means of a nut. For this purpose, the ground cable has, for example, a cable lug with a hole through which the bolt 6a can be guided. For fixing purposes, the nut is subsequently screwed onto the thread of the bolt 6a. This constitutes one of several hitherto conventional interfaces.

The embodiments according to aspects of the invention described below make it possible to use a uniform interface which, at the same time, is inexpensive to produce and is secure.

Figure 2A:
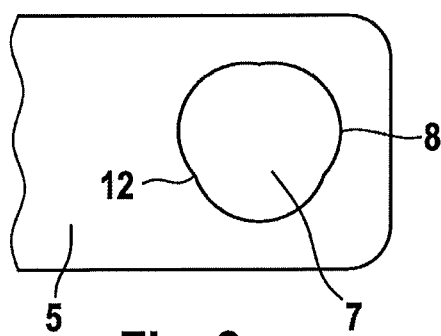
FIG. 2a shows a detail view of a hole-like opening of a first exemplary embodiment.

FIG. 2a shows a hole-like opening 7 of a first connecting element 5 of the ground contact element 4 of a sensor device 1 according to an aspect of the invention in a plan view. It can be seen that the contour 8 deviates from a circular shape. The contour 8 comprises three pressing edges 12 which prevent a rotation of the pressed-in connecting point 9 and thus of the second connecting element 6. Instead of the detent edge, the inner side of the contour may be formed with projections, curvatures or bulge-like elevations. Since its outer contour exceeds the size of the circle, delimited by the pressing edges 12, of the hole-like opening 9, the surface, in particular a possible oxide layer, of the connecting point 9 is torn away during the pressing-in of the connecting element 6, similarly to the situation in a press-fit contact on a circuit board, which improves the transmission of current.

Figure 2B:
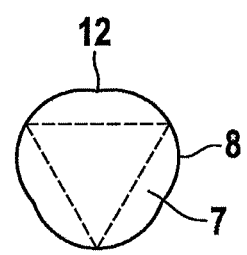
FIG. 2b shows an illustration of FIG. 2a with a geometry shown by dashed lines for illustrative purposes.

The shaping of the contour 8, which is described by circular segments on the corners of a triangle, is illustrated once again in FIG. 2b by the triangle depicted by dashed lines. In other words, the contour 8 may also be described as being made up of multiple circular arc sections which are arranged at the corners of the triangle, or generally also of a polygon.

Figure 3:
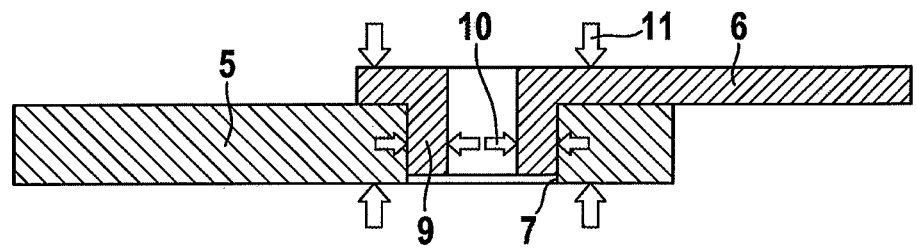
FIG. 3 shows a sectional view of the ground contact element of the sensor device according to an aspect of the invention as per the first exemplary embodiment.

FIG. 3 shows the exemplary embodiment of a sensor device according to an aspect of the invention shown in FIGS. 2a and 2b, in which the second connecting element 6 is for the most part of flat form and has, as a connecting point 9, a cylindrical flange, the outer diameter of which is at least slightly larger than the smallest free diameter of the hole-like opening 7. The contour of the hole-like opening 7 cannot be seen in the sectional illustration, but corresponds to the contour shown in FIGS. 2 and 2a.

During the pressing-in process, that has already taken place in this illustration, axial forces 11 and/or radial forces 10, depicted by arrows, act on the second connecting element depending on the method used. For example, if axial forces are imparted by tightening a screw-nut connection, then it is firstly the case that the connecting point 9 deforms owing to the three pressing edges 12, and secondly, radial forces 10 are generated which vary as viewed over the circumference. Said radial forces are greater at the pressing edges 12 and smaller at the rounded portions. The axial forces 10 required for the pressing-in process therefore remain, on average, at a level which is expedient in terms of production.

The deformation gives rise to at least a slight form fit along the circumference, which prevents a rotation of the second connecting element 6. The force-fitting connection resulting from the radial forces 10 fixes the connecting point 9 and thus the second connecting element 6 on the first connecting element 5.

Since the occurrence of the radial forces 10 is crucial for the fixing action, further measures (not illustrated) which intensify said forces are expedient. For example, it is conceivable for a thread to be situated on the inner wall of the cylindrical flange, into which thread a screw with a certain oversize is screwed such that the radial forces 10 are introduced directly. Here, as also in other pressing-in methods, an intensification of the radial forces 10 is possible by means of a conical shape of connecting point 9 and/or hole-like opening 7, which tapers downwardly in the pressing-in direction. This principle of the self-intensification or of the oblique plane may also be utilized if the contours of the connecting point 9 and of the hole-like opening 7 run in the same manner, that is to say the type of deformation described above does not occur.

Since the hole-like opening 7 is dimensioned such that the bolt mentioned in the description of FIG. 1 can also be pressed therein, this exemplary embodiment can be used flexibly for all common interfaces of ground contact elements.

Figure 4:
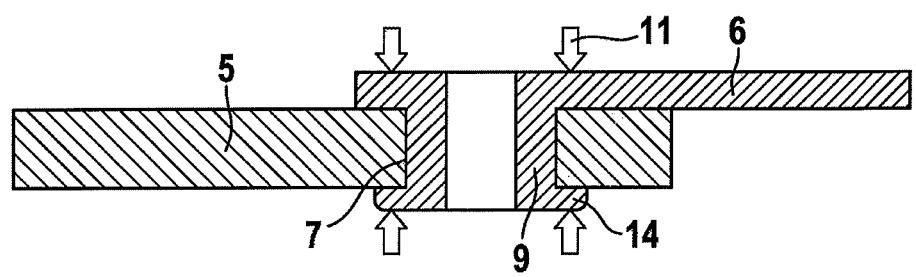
FIG. 4 shows a sectional view of the ground contact element of the sensor device according to an aspect of the invention as per a third exemplary embodiment.

A second exemplary embodiment is shown in FIG. 4. The connecting point 9 of the first connecting element 5 is in this case designed so as to project beyond the second connecting element 6. The ends are formed as a radial collar 14, or as a rivet collar pressed against the first connecting element 5. Further features have already been discussed in conjunction with FIG. 3 and shall not be repeated at this juncture.

Figure 5:
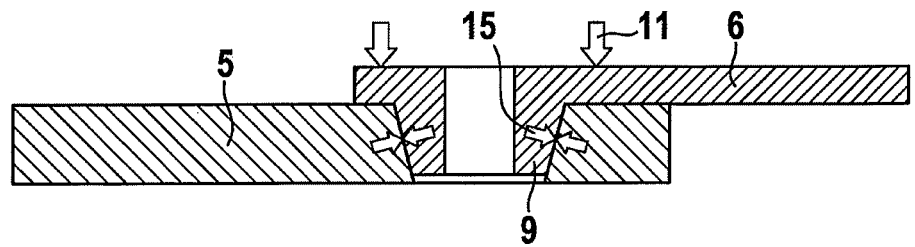
FIG. 5 shows a sectional view of the ground contact element of the sensor device according to an aspect of the invention as per a fourth exemplary embodiment.

FIG. 5 shows a third exemplary embodiment, in which the hole-like opening 7 of the first connecting element 5, and the connecting point 9 of the second connecting element 6, are of conical or oblique form. The axial forces 11, regardless of the manner in which they are imparted, thus act proportionately on the pressed-together surfaces of the connecting point 9 of the second connecting element 6 and of the hole-like opening 7 of the first connecting element 5, or said forces assist the radial forces in the form of the oblique forces 15. Further illustrated features of this exemplary embodiment correspond to those of the first and second exemplary embodiments, and will therefore not be repeated.

The invention claimed is:

1. A sensor device for measuring a current flow, from a current source comprising:

a sensor element for detecting the current flow,
a first contact element for connecting the sensor element to the current source,
a ground contact element for connecting the sensor element to ground, wherein the ground contact element comprises a first and second electrically conductive connecting element,
wherein the first connecting element has a hole-like opening, the hole-like opening having a contour with a shape defined by circular segments adjoining one another, the central points of the circular segments lying on corners of a polygon such that the circular segments do not define a continuous circle, and
wherein the second connecting element has a connecting point which can be pressed into the hole-like opening of the first connecting element such that the second connecting element is fixed to the first connecting element.

2. The sensor device as claimed in claim 1, wherein the hole-like opening of the first connecting element and/or the connecting point of the second connecting element has a circle-like contour.

3. The sensor device as claimed in claim 1, wherein the connecting point of the second connecting element has a cylindrical basic shape which is elastically or plastically deformable.

4. The sensor device as claimed in claim 3, wherein the connecting point of the second connecting element exhibits ductility which enables the connecting point to entirely or partially adopt the shape of the contour of the hole-like opening of the first connecting element.

5. The sensor device as claimed in claim 1, wherein the hole-like opening and/or the connecting point are of conical form.

6. The sensor device as claimed in claim 1, wherein the sensor device is a battery sensor unit.

7. The sensor device as claimed in claim 1, wherein, perpendicular to a pressing-in direction, a greatest extent of the connecting point corresponds at least to a smallest extent of the hole-like opening.

8. The sensor device as claimed in claim 1, wherein the connecting point of the second connecting element is formed as a hollow cylinder.

9. The sensor device as claimed in claim 8, wherein the hollow cylinder, by a rivet or a pressed-in bolt on its inner side, forms an interference-fit connection with the first connecting element.

10. The sensor device as claimed in claim 8, wherein the hollow cylinder has an internal thread.

11. The sensor device as claimed in claim 10, wherein the ground contact element has a screw or screw-nut connection to the internal thread of the hollow cylinder.

12. The sensor device as claimed in claim 11, wherein the sheet-metal flange has a wall thickness which permits a deformation adequate for the pressing-together and/or has slots which permit a deformation adequate for the pressing-together.

13. The sensor device as claimed in claim 8, wherein the hollow cylinder is formed as a sheet-metal flange.

14. The sensor device as claimed in claim 1, wherein the connecting point of the second connecting element projects beyond the first connecting element in the pressing-in direction, and is formed at its projecting region as a radial collar.

* * * * *